United States Patent
Mekdhanasarn et al.

[11] Patent Number: 5,891,760
[45] Date of Patent: Apr. 6, 1999

[54] LEAD FRAME WITH ELECTROSTATIC DISCHARGE PROTECTION

[75] Inventors: Boonmi Mekdhanasarn, Sunnyvale; Randy Hsiao-Yu Lo, Campbell, both of Calif.

[73] Assignee: National Semiconductor Corporation, Santa Clara, Calif.

[21] Appl. No.: 47,884

[22] Filed: Mar. 25, 1998

Related U.S. Application Data

[62] Division of Ser. No. 744,681, Nov. 6, 1991, Pat. No. 5,773,876.

[51] Int. Cl.$^6$ .......................... H01L 21/44; H01L 21/48; H01L 21/50

[52] U.S. Cl. .......................... 438/123; 438/106; 438/121; 438/127

[58] Field of Search ...................................... 438/123, 124, 438/125, 126, 127, 121, 106

[56] References Cited

U.S. PATENT DOCUMENTS

| | | |
|---|---|---|
| 3,816,334 | 6/1974 | Yamazaki . |
| 3,958,195 | 5/1976 | Johnson . |
| 4,477,827 | 10/1984 | Walker et al. . |
| 4,559,579 | 12/1985 | Val . |
| 4,617,605 | 10/1986 | Obrecht et al. . |
| 4,928,199 | 5/1990 | Diaz et al. . |
| 5,061,988 | 10/1991 | Rector . |
| 5,147,822 | 9/1992 | Yamazaki et al. . |
| 5,343,074 | 8/1994 | Higgins, III et al. . |
| 5,444,593 | 8/1995 | Allina . |
| 5,457,299 | 10/1995 | Blais et al. . |
| 5,550,402 | 8/1996 | Nicklaus . |
| 5,552,951 | 9/1996 | Pasch et al. . |
| 5,644,167 | 7/1997 | Weiler et al. . |
| 5,668,032 | 9/1997 | Holmberg et al. . |

*Primary Examiner*—Kevin M. Picardat
*Assistant Examiner*—Deven Collins
*Attorney, Agent, or Firm*—Beyer & Weaver, LLP

[57] ABSTRACT

A lead frame having protection against electrostatic discharge is disclosed. The lead frame having protection against electrostatic discharge includes a multiplicity of leads and an electrostatic discharge protection device. The electrostatic discharge protection device includes a conductive layer and a protection layer. The protection layer is arranged to contact a plurality of leads and is formed from an electrostatic discharge protection material, which insulates the leads from the conductive layer at voltages below a predefined threshold voltage and establishes an electrical connection between the leads and the conductive layer at voltages above the threshold voltage.

14 Claims, 4 Drawing Sheets

LEAD FRAME WITH ELECTROSTATIC DISCHARGE PROTECTION

This is a divisional application of prior application Ser. No. 08/744,681 filed on Nov. 6, 1996, now U.S. Pat. No. 5,773,876.

BACKGROUND OF THE INVENTION

This invention relates generally to lead frames for use in packaged integrated circuits. More particularly it relates to lead frames designs that incorporate electrostatic discharge protection to reduce the likelihood of integrated circuit burnout in the event of an electrostatic discharge.

It is well known that the unavoidable and naturally occurring phenomenon of electrostatic discharge can induce very high currents and voltage surges, which may exceed many thousands of volts. In the absence of any integrated circuit protection device, the current surge or overvoltage may penetrate an integrated circuit and cause hardware damage such as integrated circuit burnout or electronic malfunction, e.g. memory loss or loss of transmission data. Integrated circuits that are manufactured using the Metal Oxide Semiconductor (MOS) or similar technology may be considered, as an example of integrated circuits that may be rendered inoperable by electrostatic discharge. As is well known to those of skill in the art, Metal Oxide Semiconductor (MOS) devices generally employ a gate structure, which includes an insulative thin film layer typically formed from silicon dioxide. Under overvoltage conditions that may be attributed to electrostatic discharge, the thin film gate insulative layer may suffer from dielectric breakdown of potentials, for example, around 10 volts for a 0.35 micron process whereby the gate is shorted and the entire device is rendered inoperable. As the integrated circuit fabrication technology moves to smaller feature sizes designed to operate under lower current densities, the energy necessary to cause such damage is reduced even further.

In an effort to protect integrated circuits against overvoltage in general and by electrostatic discharge in particular, manufacturers have incorporated a variety of circuit protection devices into chip designs. By way of example, one prior art integrated circuit package design that incorporates a circuit protection device is disclosed by U.S. Pat. No. 4,928,199 to Diaz et al. In this design, an integrated circuit package includes a die that is protected by a metallic cavity cover, which is connected to ground voltage and functions as ground plane. The circuit protection device, e.g. a glass layer, is placed on an interior surface of the cavity cover such that it contacts bonding wires, which connect bond pads on the die to leads on a lead frame.

Under normal operating conditions, the circuit protection device has high resistance. In response to a short voltage surge, however, the circuit protection device in a relatively short period of time is transformed from its high resistance state to a low resistance state. Soon after the short voltage surge comes to an end, the circuit protection device reverts back to its original high resistance state.

In the prior art integrated circuit package design mentioned above, a voltage surge generated from external circuitry entering into the integrated circuit package passes through the bonding wires, which are in contact with the circuit protection device. In response to the voltage surge, the circuit protection device transforms itself from a high resistance state to a low resistance state and conducts the voltage surge to the ground plane cavity cover. In this manner, the circuit protection device protects the die from a burnout that may result from a voltage surge generated at external circuitry. Although this design protects the die from voltage surges, it suffers from several drawbacks. Accordingly, improved integrated circuit package designs that provide adequate electrostatic discharge protection utilizing an efficient process for manufacturing such a package design would be desirable.

SUMMARY OF THE INVENTION

In one aspect of the present invention, a lead frame having protection against electrostatic discharge is set forth. The lead frame having protection against electrostatic discharge includes a multiplicity of leads and an electrostatic discharge protection device. The electrostatic discharge protection device includes a conductive layer and a protection layer. The protection layer is arranged to contact a plurality of leads and is formed from an electrostatic discharge protection material, which insulates the leads from the conductive layer at voltages below a predefined threshold voltage and establishes an electrical connection between the leads and the conductive layer at voltages above the threshold voltage.

In another aspect of the present invention, a packaged semiconductor device is set forth. The packaged semiconductor device includes the lead frame as described above, a die having a plurality of bond pads, a plurality of bonding wires electrically connecting associated ones of the bond pads to associated ones of the leads and an encapsulation material encapsulating a portion of the packaged semiconductor and leaving exposed a portion of the leads to facilitate electrical connection to external circuitry.

In yet another aspect of the present invention, a process for making a lead frame having electrostatic discharge protection is set forth. The process includes providing a lead frame having a multiplicity of leads and applying an electrostatic discharge protection device to a plurality of leads. The device includes a conductive layer and a protection layer such that the protection layer physically contacts a plurality of leads and the protection layer is formed from an electrostatic discharge protection material.

In yet another aspect of the present invention, a process of forming a electrostatic discharge protection device is set forth. The process includes obtaining a conductive layer and a protection layer formed from an electrostatic discharge protection polymer which is capable of adhesion at higher temperatures, applying enough heat to the polymer to activate its adhesive characteristics and pressing the conductive layer on the polymer to form the electrostatic discharge protection device.

DETAILED DESCRIPTION OF THE PREFERRED EMBODIMENTS

The present invention relates to lead frames that incorporate an electrostatic discharge protection device to protect integrated circuits against a voltage surge that may be caused by an electrostatic discharge. Also, processes for manufacturing integrated circuit packaging containing the novel lead frames is also disclosed. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1:
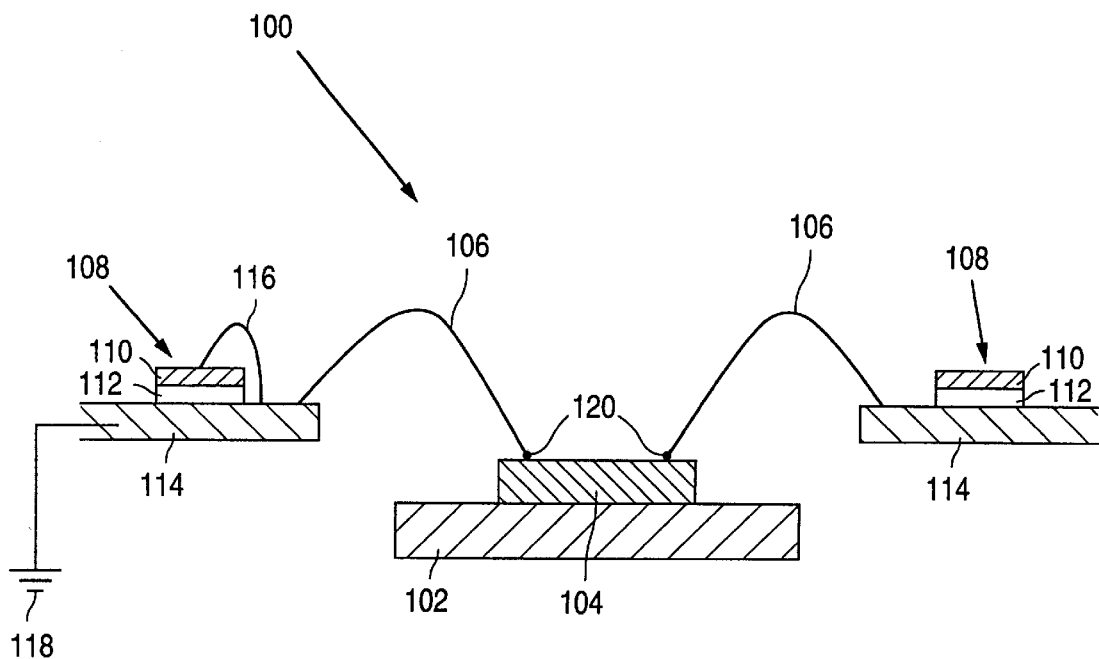
FIG. 1 is a side-sectional view of a lead frame according to one embodiment of the present invention incorporating an electrostatic discharge protection device therein.

Referring to FIG. 1, one embodiment of a lead frame which incorporates an electrostatic discharge protection device according to the present invention is shown. In this embodiment, a lead frame 100 includes a plurality of leads 114, which typically connect to external circuitry (not shown) on one end. An electrostatic discharge protection device 108 includes a conductive layer 110 disposed above a protection layer 112, which is formed from an electrostatic discharge material and physically contacts leads 114. A ground wire 116 connects conductive layer 110 to one of leads 114, which is connected to ground voltage, as shown in FIG. 1, and therefore functions as the ground plane.

A die 104, which generally contains the sensitive circuitry and a plurality of bond pads 120, is mounted on a die attach area, e.g. a die attach pad 102. The die may be electrically connected to the leads in any conventional manner. By way of example, this is most commonly accomplished through the use of a plurality of bonding wires 106 which connect associated ones of leads 114 to associates ones of bond pads 120 on die 104. As is well known to those of skill in the art, a lead frame package is arranged to encapsulate die 104, bonding wires 106, bond pads 120 device 108, grounding wires 116 and a portion of leads 114.

Figure 3:
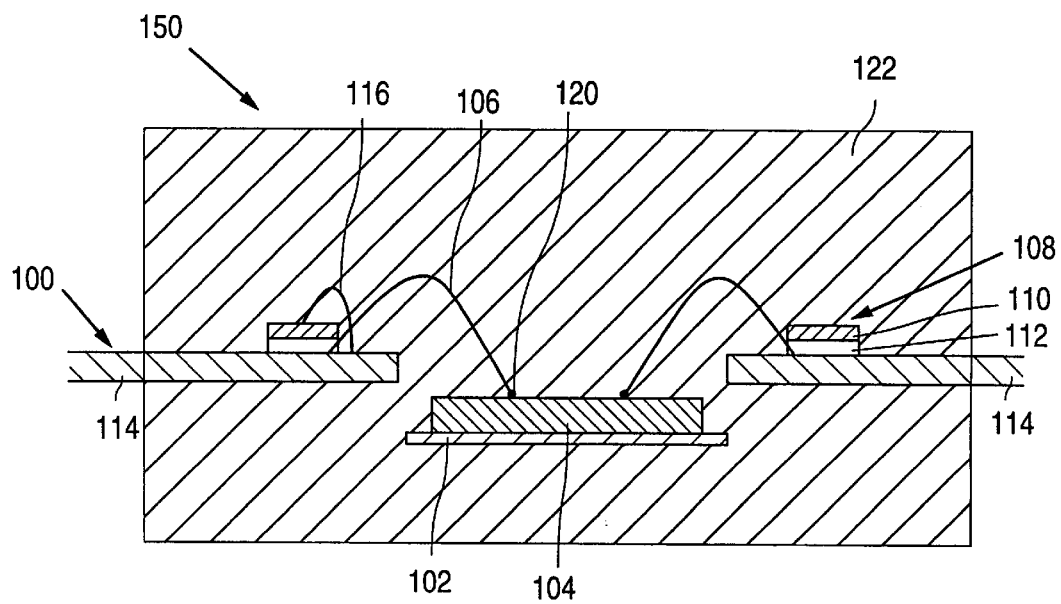
FIG. 3 is a side-sectional view of a package incorporating the lead frame of FIG. 1.
Figure 2:
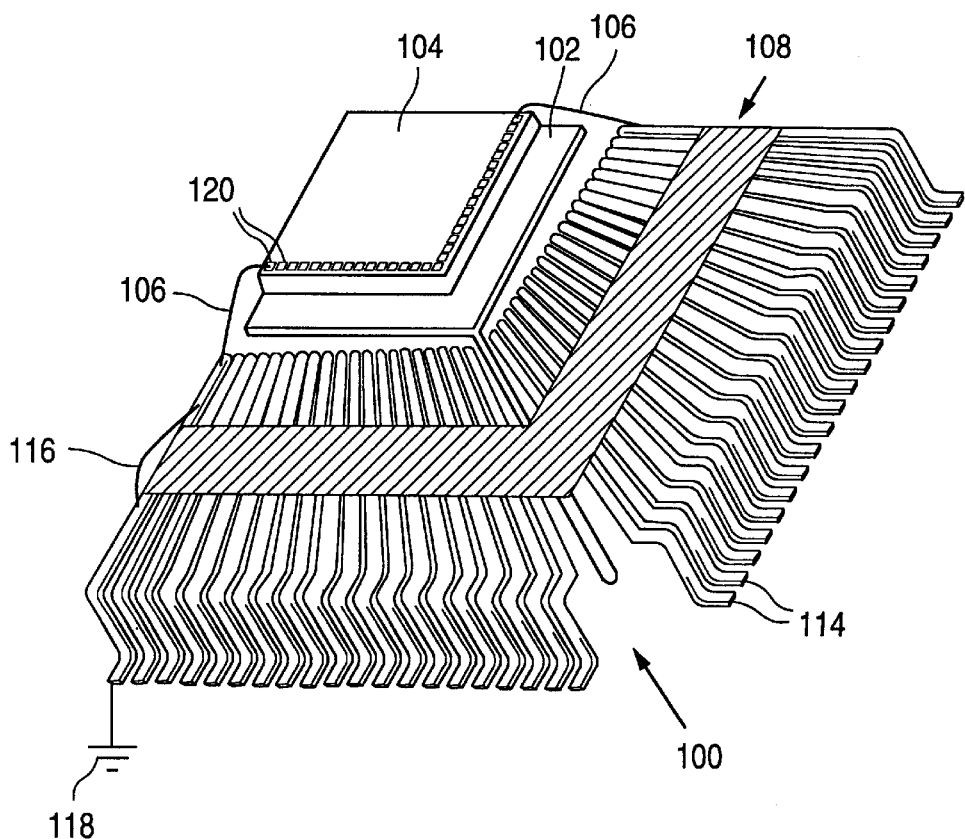
FIG. 2 is a trimetric view of one quadrant of the lead frame having electrostatic discharge protection according to one embodiment of the present invention.

FIG. 2, for illustrative purposes, shows a trimetric view of one quadrant of the lead frame having electrostatic discharge protection according to one embodiment of the present invention. FIG. 3 shows a side-sectional view of a packaged integrated circuit 150 that may incorporate lead frame 100 having electrostatic discharge protection according to one embodiment of the present invention. According to FIGS. 2 and 3, die attach pad 102, die 104, bonding wires 106, bond pads 120, device 108, leads 114, grounding wire 116 are in substantially the same configuration as in FIG. 1. As shown in FIG. 3, encapsulation material 122 encapsulates die 104, bonding wires 106, bond pads 120, device 108, grounding wires 116 and a portion of leads 114.

When a voltage surge, which equals or exceeds the predefined threshold voltage of the protection layer 112, enters integrated circuit package 100 from a particular lead 114, it encounters the protection layer 112 of electrostatic discharge protection device 108. In response to the voltage surge, protective layer- 112 transforms from a normally high resistance state to a low resistance state and substantially conducts the voltage surge through conductive layer 110, ground wire 116 to one of leads 114 functioning as ground plane. In this manner, electrostatic discharge protection device 108 shunts the voltage surge to ground and protects the sensitive circuit components of die 104 from possible burnout by electrostatic discharge. As soon as the voltage surge comes to an end, the protection layer 112 reverts back to its normal state of high resistance.

It should be noted that although package 100, as shown in FIG. 1, shows a single chip module assembly, the present invention is not limited to single die configurations. Rather, the single die configuration detailed above is used as an example to illustrate the simplicity of a packaged integrated circuit design according to the present invention and its advantages over the prior art. In fact, the described invention applies equally well to multi-chip module assemblies.

Leads 114, bonding wires 106 and ground wire 116 may be constructed from materials well known to those skilled in the art. For example, in order to construct leads 114, copper is used primarily because it has the desirable properties of being a good conductor which is relatively easy to etch, in addition to being cost effective. Die 104 generally refers to a chip or an integrated circuit or any electrical device that may contain circuitry sensitive to a voltage surge. Die, as is well known to those skilled in the art, generally has bond pads 120, which facilitate the electrical connection between the die and the leads. Die attach area, upon which die 104 is mounted, may take the form of a die attach pad 102 on lead frame 100, a substrate in combination with a void area on the lead frame or a variety of other structures that are well known to those skilled in the art.

Device 108, as shown in the embodiment of FIG. 1, includes two layers, i.e. a conductive layer 110 and a protection layer 112. Conductive layer 110 may be formed from any suitable conductive material. By way of example copper has been found to work well. In some embodiments, the copper (or at least a portion thereof) is plated with silver. Silver plating facilitates the bonding of ground wire 116 on conductive layer 110. Alternatively, in another embodiment of the present invention device 108 may also include a spacer or filler material disposed between conductive and protective layers 108 and 112. A detailed discussion of this embodiment of is set forth below in conjunction with the discussion of FIGS. 6A and 6B.

Protection layer 112 may be formed from any suitable resistive current sensitive material that is capable of significantly conducting electricity at a predefined threshold voltage. By way of example, a polymer material, referred to as Surg X™, available from Surg X, of Fremont, Calif. may be employed. The threshold voltage required to transform the normally resistive protection layer 112 to a substantially conductive material may vary to a great extent in accordance with the needs of a particular system. By way of example, threshold voltage in a range from between about 10 to about 500 volts will be appropriate in most conventional packaging arrangements. The threshold voltage preferably ranges from between about 10 to about 100 volts and more preferably ranges from between about 10 to about 50 volts.

In one embodiment of the present invention, the polymer in protection layer 112 may also have adhesive characteristics, which allow device 108 to effectively attach to leads 114. In one embodiment, device 108 is constructed from a compressible material that has enough strength to hold leads 114 together and protective layer 112 includes a B-stageable polymer.

Figure 4:
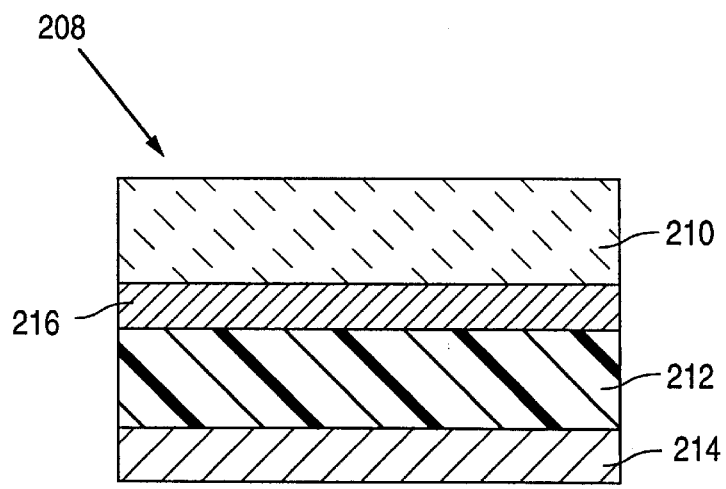
FIG. 4 is a side-sectional view of the electrostatic discharge protection device according to an alternative embodiment of the present invention.

Referring now to FIG. 4, an alternative embodiment of the electrostatic discharge protection device is shown. In this embodiment, an electrostatic discharge protection device 208, includes a conductive adhesive layer 216 adhering at the top surface to a conductive layer 210 and at the bottom surface to a protection layer 212. Protection layer 212, in turn, adheres to an anisotropic conductive adhesive layer 214 disposed below. Anisotropic conductive layer 214 conducts electricity in the vertical direction and also ensures that device 208 effectively adheres to the leads in a lead frame. This embodiment is preferably implemented when the protection layer of the electrostatic discharge protection device as shown in FIG. 1 does not effectively adhere to the leads in a lead frame due to lack of appropriate adhesive characteristics of the protection layer.

In one embodiment of the present invention, electrostatic discharge protection device is applied next to a lead frame tape XB-560 (referred to as the "Brady tape" hereinafter) manufactured by Brady Precision Tape of Milwaukee, Wis. Brady tape, as is well known to those of skill in the art, includes a polyimide material, which is commonly used to firmly hold the leads together in place while processing steps, such as wire bonding, are being conducted. Alternatively, electrostatic discharge protection device can be employed in place of Brady tape whereby the device also functions to effectively holds leads 114 together during the various package fabrication processes. The thickness of the device primarily depends on the thickness of the integrated circuit package.

The electrostatic discharge protection device is employed in package 100 in any suitable form. By way of example, the device could be a multilayered structure in the form of a strip, ribbon or square shaped ring. If the device is employed in the form of strips or ribbon, strips of the device are applied to the generally square shaped lead frame one section at a time. Furthermore, at least four different ground wires 116 may be required, i.e. one ground wire for each section. This configuration ensures that the conductive layer of the device in each section of the lead frame is connected to a ground plane and thereby each section of the lead frame is appropriately protected against a voltage surge. If the device is employed as a square shaped ring, however, the entire device is attached to all four sections of the lead frame at once and only a single ground wire connection from conductive layer of the device to ground plane is necessary to effectively protect each section of the lead frame against a voltage surge. Thus, it may be preferable to employ the electrostatic discharge protection device in the form of a square shaped ring because this design requires less ground connections and is therefore an easier design to implement.

Figure 5:
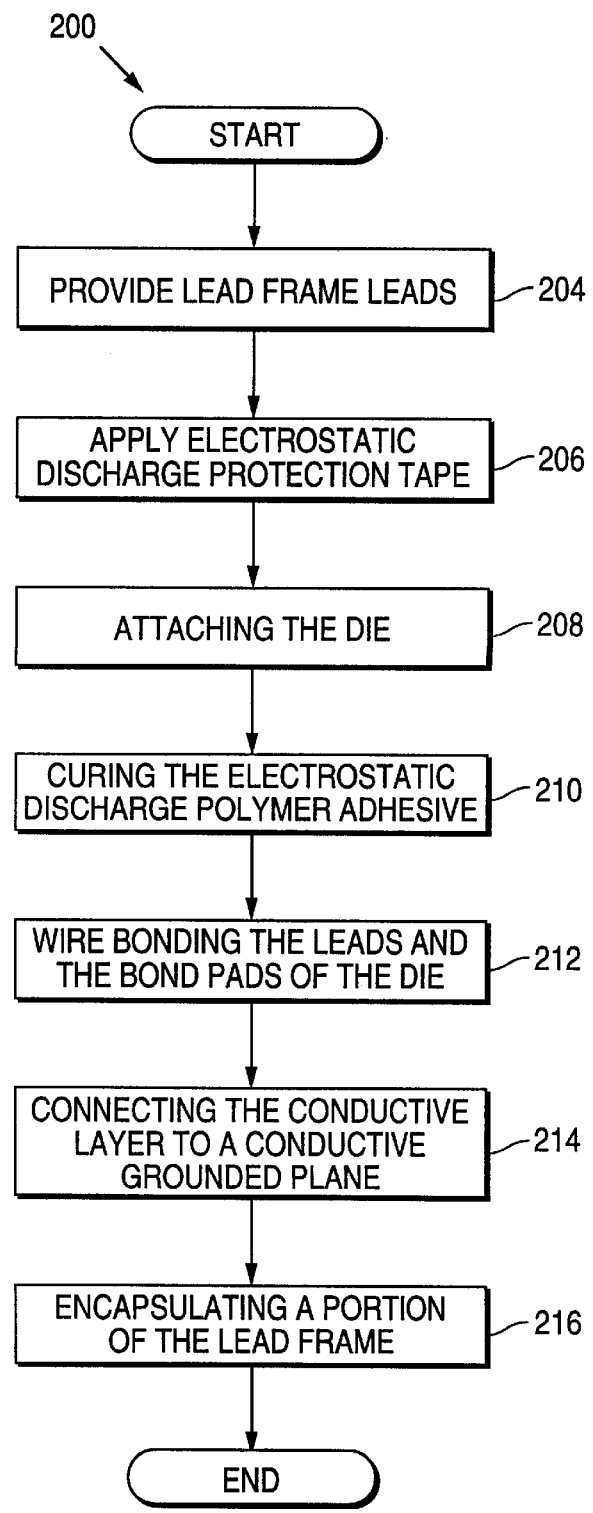
FIG. 5 is a flowchart of a process of packaging an integrated circuit that incorporates the electrostatic discharge protection device therein according to one embodiment of the present invention.

Referring now to FIG. 5, a process 200 for packaging an integrated circuit utilizing a packaging structure that incorporates an electrostatic discharge protection device according to the present invention will be described. In step 204 leads in a lead frame may be formed by any conventional technique used for fabricating lead frames. By way of example, methods such as stamping or etching work well in constructing leads for the present invention.

In step 206, electrostatic discharge protection device is applied to the leads of a lead frame. By way of example, in the embodiment shown in FIG. 1 the adhesive property of the polymer in protection layer 112 ensures that device 108 adheres to the leads and in the embodiment shown in FIG. 2, the adhesive anisotropic conductive layer 214 ensures that device 208 adheres to the leads. In order to mechanically affix the device to the leads, a conventional taping machine, well known to those skilled in the art, may be employed. Device 108 as discussed herein may be obtained from a commercial supplier such as Surg X, of Fremont, Calif. and its various layers may come wound-up in a spool.

Alternatively, in one embodiment of the present invention, the device of FIG. 1 may be constructed as follows. A conductive layer and a protection film or layer is obtained. The protection layer is formed from an electrostatic discharge protection material that may include a B-stageable polymer. It is well known in the art that a B-stageable polymer is a partially cured polymer that tends to be hard at room temperature, sticky at higher temperatures and begins to cure at elevated temperatures. The electrostatic discharge protection layer is applied on the conductive layer by firmly pressing a conductive layer surface on the protection layer. The resulting two layered device is then lightly heated to activate the polymer's adhesive properties, i.e. the polymer becomes sticky, ensuring a stronger physical contact between the surfaces of the conductive layer and the protection layer. The device may undergo curing next if the physical contact between the surfaces of the two layers is not a strong enough, otherwise the device is preferably cured after the device is attached to the leads and the entire assembly of device and the leads is cured as described below.

In the present invention, the embodiment of the electrostatic discharge protection device shown in FIG. 2, may be constructed similarly. For example, conductive adhesive layer 216, electrostatic discharge protection layer 212 and anisotropic conductive adhesive 214 may include a B-stageable polymer which facilitates in establishing surface contacts among the appropriate layers and or the conductive layer. The resulting layered structure can be lightly heated to strengthen the surface contacts among the layers. Silver plating above the conductive layer in the embodiments of FIGS. 1 and 4 is provided by conventional plating techniques, e.g. electroplating.

In order to attach the electrostatic discharge protection device of the present invention, e.g. device 108 or 208 as shown in FIGS. 1 and 4, respectively, to the leads, the leads and the polymer side of the device may be heated. Heating the polymer makes the protection layer of the device sticky again. The device is then firmly pressed on the leads to attach the device to the leads. The entire assembly of the leads with the device is then placed in an oven to complete curing the polymer. The range of temperature treatment during curing primarily depends upon the nature of polymer being cured and the duration of the temperature treatment. For example, for a polymer that is cured in a short duration, i.e. in the order of a fraction of a second, the curing temperature should be less than about 300° C. and for a polymer that is cured in a long duration, i.e. in the range of between about 1 to about 10 seconds, the curing temperature should be less than about 200° C.

Figure 6A:
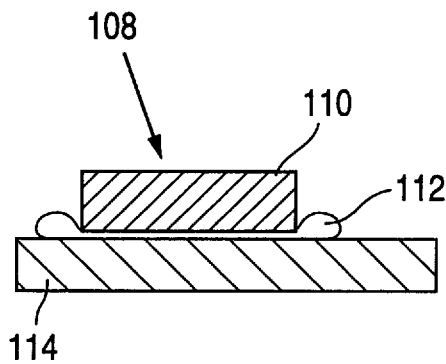
FIG. 6A is a side-sectional view of the electrostatic discharge protection device attached to the leads showing the protection layer spilling out as a result of excessive force applied during the application of the electrostatic discharge protection device to the leads.

It is important to apply the appropriate amount of force during the application of the electrostatic discharge protection device on the leads. Now referring to FIG. 6A, a potential problem that might arise if excessive force is employed during the application of the device on the leads is described. By way of example, the embodiment of FIG. 1 is used to illustrate the problem. If excessive force is used to firmly press device 108 on leads 114, protection layer 112 spills out, as shown in FIG. 6A. Consequently, conductive layer 110, at least in part, physically contacts the underlying lead 114 as shown and creates a short-circuit.

Figure 6B:
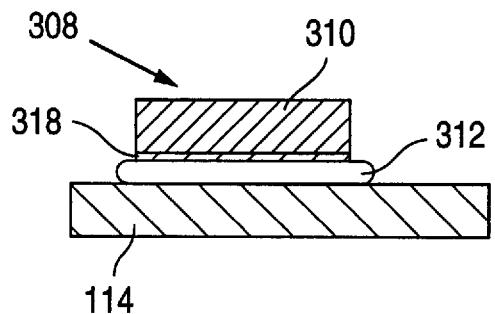
FIG. 6B is a side-sectional view of the electrostatic discharge protection device, which includes a spacer or filler material according to one embodiment of the present invention and thereby reduces the likelihood of short-circuiting that may result from the protection layer oozing out as shown in FIG. 6A.

The likelihood of causing the short-circuit during the device application process described above is reduced by including a layer of spacer or filler material 318 in device 308 as shown in FIG. 6B. According to this embodiment, spacer or filler material 318, disposed between conductive layer 310 and protective layers 312, prevents conductive layer 310 from physically contacting leads 314 and shorting out. Conductive and protection layers 310 and 312 are functionally equivalent to the conductive and protection layers 110 and 112 as shown in FIG. 1. Spacer or filler material 318 may be constructed from any amorphous, conventional spacer material well known to those skilled in the art. In one embodiment of the present invention, the spacer or filler material is part of the electrostatic discharge protection formulation in the protection layer. As such, it is important to control the particle size of the spacer or filler material so that the thickness of the protection layer of the device is uniform throughout.

Protection layer of the electrostatic discharge protection device should be of appropriate thickness. A very thin protection layer may be undesirable because it would be more susceptible to oozing out and creating a short-circuit as described above. In contrast, an extremely thick protection layer would impede the formulation in the protection layer to trigger in the event of a voltage surge that equals or exceeds the predefined threshold voltage of the protection layer.

It should be noted that the thickness of layers in the electrostatic discharge protection device are not drawn to scale and their thickness will depend on several factors. By way of example, if the conductive layer comes wound-up on a spool, it should preferably be thin so that it can curl around the spool with ease. The thickness of the conductive layer primarily depends on the compactional composition of the electrostatic discharge protection material in the protection layer and the range of the threshold voltage at which the electrostatic discharge formulation is designed to trigger. The thickness of the protection layer will generally range from about 0.0002 inches to about 0.005 inches.

In step 208, die may be mounted on the lead frame at a die attach area, such as a die attach pad, using conventional techniques well known to those skilled in the art. Alternatively, the die may be attached to the lead frame by a double sided polyimide tape. In step 210, the electrostatic discharge protection polymer on the lead undergoes curing. In one embodiment, steps 208 and 210 can be carried out simultaneously, i.e. the polymer is cured while the die is being mounted on the lead frame. In step 212, the die is electrically coupled to the leads, which is typically done by a plurality of bonding wires that connect associated ones of the bond pads on the die to associated ones of the leads. In step 214, at least one of the leads in the lead frame is connected to ground voltage establishing ground plane. Step 216 includes encapsulating the die, the bonding wires, the device, the grounding wires and a portion of the leads to provide a protective package and leaving exposed a portion of the leads to facilitate electrical connection of the integrated circuit package to external circuitry. A commonly used encapsulation material is epoxy since it can be easily and cost effectively applied by transfer molding.

While this invention has been described in terms of several preferred embodiments, there are alterations, permutations, and equivalents which fall within the scope of this invention. It should also be noted that there are many alternative ways of implementing the methods and apparatuses of the present invention, e.g. the present invention's protection against electrostatic discharge will be just as effective in other applications where there is a different source responsible for a voltage surge. It is therefore intended that the following appended claims be interpreted as including all such alterations, permutations, and equivalents as fall within the true spirit and scope of the present invention.

What is claim is:

1. A process for making a lead frame having electrostatic discharge protection, the method comprising the steps of:
    providing a lead frame having a multiplicity of leads; and
    applying an electrostatic discharge protection device to a plurality of leads, the device comprising a conductive layer and a protection layer such that the protection layer physically contacts a plurality of leads, wherein the protection layer is formed from an electrostatic discharge protection material that insulates the leads from the conductive layer at voltages below a predefined threshold voltage and establishes an electrical connection between the leads and the conductive layer at voltages above the predefined threshold voltage.

2. The process of claim 1, further comprising the steps of:
    electrically connecting the conductive layer of the device to at least one of the multiplicity of leads, wherein said at least one of the multiplicity of leads is configured to function as a ground plane;
    mounting a die on the lead frame, the die including a plurality of bond pads;
    electrically connecting the die to appropriate leads of the lead frame using a set of bonding wires, each bonding wire having a first end coupled to an associated bond pad and a second end coupled to an associated lead; and
    encapsulating the die, the bonding wires, the grounding wire, the device and a portion of the leads to provide a protective package and leaving exposed a portion of the leads to facilitate electrical connection of the leads to external circuitry.

3. The process of claim 1, further comprising the step of electroplating silver above the conductive layer.

4. A process of forming an electrostatic discharge protection device, comprising:
    obtaining a conductive layer and a protection layer formed from an electrostatic discharge protection polymer which is capable of adhesion at higher temperatures;
    applying enough heat to the polymer to activate its adhesive characteristics; and
    pressing the conductive layer on the polymer to form the electrostatic discharge protection device.

5. The process of claim 4 further comprising a step of curing the device.

6. A process of applying the electrostatic discharge protection device formed by a process according to claim 4 a plurality of leads in a lead frame, comprising:
    heating the leads in a lead frame;
    heating the polymer layer of the device to activate its adhesive characteristics; and
    pressing the device onto the leads.

7. The process of claim 6, further comprising the step of curing the device on the leads.

8. A process for making a packaged semiconductor device, comprising:
    forming a lead frame having protection against electrostatic discharge, including:
        providing a multiplicity of leads, wherein at least one of the multiplicity of leads is configured to function as a ground plane; and applying an electrostatic discharge protection device to the multiplicity of leads, the electrostatic discharge protection device including a spacer material between a conductive layer and a protection layer formed from an electrostatic discharge protection material, the protection layer being arranged to contact the multiplicity of leads, wherein the electrostatic discharge protection material insulates the leads from the conductive layer at voltages below a predefined threshold voltage and establishes an electrical connection between the leads and the conductive layer at voltages above the threshold voltage; and connecting a grounding wire from the conductive layer to the ground plane;

providing a die having a plurality of bond pads;

electrically connecting a plurality of bonding wires from associated ones of the bond pads to associated ones of the leads; and encapsulating a portion of the packaged semiconductor by an encapsulation material and leaving exposed a portion of the leads to facilitate electrical connection to external circuitry.

9. The process of claim 8, wherein in said applying the electrostatic discharge protection device takes the form of a square ring shaped polymer tape.

10. The process of claim 8, wherein the predefined threshold voltage is in a range of between about 10 and about 500 volts.

11. The process of claim 8, further comprising forming a silver plating overlying the conductive layer to facilitate electrically connecting a bonding wire to the conductive layer.

12. The process of claim 8, wherein the electrostatic discharge protection device further comprising:

a conductive adhesive layer disposed between the conductive layer and the protection layer for securing the conductive layer to the protection layer; and an anisotropic adhesive layer disposed between the protection layer and the plurality of leads for securing the electrostatic discharge protection device to the plurality of leads.

13. The packaged semiconductor device of claim 12, wherein at least one of the protection layer, the conductive adhesive layer and the anisotropic adhesive layer comprises a B-stageable polymer.

14. The packaged semiconductor device of claim 8, wherein the thickness of the protection layer ranges from between about 0.0002 to about 0.005 inches.

* * * * *